(12) United States Patent
Ihara et al.

(10) Patent No.: US 9,313,880 B2
(45) Date of Patent: Apr. 12, 2016

(54) PRINTED CIRCUIT BOARD, PRINTED CIRCUIT BOARD ASSEMBLY SHEET AND METHOD OF MANUFACTURING THE SAME

(75) Inventors: Terukazu Ihara, Ibaraki (JP); Naohiro Terada, Ibaraki (JP)

(73) Assignee: NITTO DENKO CORPORATION, Ibaraki-shi, Osaka (JP)

( * ) Notice: Subject to any disclaimer, the term of this patent is extended or adjusted under 35 U.S.C. 154(b) by 0 days.

(21) Appl. No.: 13/218,510

(22) Filed: Aug. 26, 2011

(65) Prior Publication Data

US 2012/0069538 A1 Mar. 22, 2012

(30) Foreign Application Priority Data

Sep. 16, 2010 (JP) ................................. 2010-207636

(51) Int. Cl.
*H05K 1/02* (2006.01)
*G11B 5/48* (2006.01)
*H05K 3/00* (2006.01)

(52) U.S. Cl.
CPC .............. *H05K 1/0269* (2013.01); *G11B 5/486* (2013.01); *H05K 3/0097* (2013.01); *Y10T 29/49126* (2015.01)

(58) Field of Classification Search
CPC .................. H05K 3/3452; H05K 2201/10287; H05K 1/0206; H05K 1/0393; H05K 1/092; H05K 3/429; H05K 3/0097; H05K 1/0269; H01L 2924/01079; H01L 2924/01078; H01L 23/49811; G11B 5/486; Y10T 29/49126
USPC ..................... 174/250–267; 361/749; 438/462
See application file for complete search history.

(56) References Cited

U.S. PATENT DOCUMENTS

| | | | | |
|---|---|---|---|---|
| 6,388,201 B2 * | 5/2002 | Yamato et al. | ................ | 174/255 |
| 6,399,899 B1 * | 6/2002 | Ohkawa et al. | ................ | 174/261 |
| 6,560,864 B1 * | 5/2003 | Chang et al. | .................... | 29/846 |
| 8,460,563 B2 * | 6/2013 | Ishii et al. | ........................ | 216/13 |
| 2008/0232752 A1 * | 9/2008 | Watanabe | ..................... | 385/123 |
| 2010/0032201 A1 * | 2/2010 | Ooyabu et al. | ................ | 174/262 |
| 2010/0175913 A1 | 7/2010 | Ishigaki | | |

FOREIGN PATENT DOCUMENTS

| | | | |
|---|---|---|---|
| CN | 101578011 | A | 11/2009 |
| CN | 101646299 | A | 2/2010 |
| CN | 101778529 | A | 7/2010 |
| JP | S55-27267 | Y2 | 6/1980 |
| JP | S5527267 | Y2 | 6/1980 |
| JP | H10-223999 | A | 8/1998 |
| JP | 2001-007460 | A | 1/2001 |

(Continued)

OTHER PUBLICATIONS

JP 55-27267 Y2 published on Jun. 30, 1980; English Translation.*

(Continued)

*Primary Examiner* — Jenny L Wagner
*Assistant Examiner* — Pete Lee
(74) *Attorney, Agent, or Firm* — Panitch Schwarze Belisario & Nadel LLP

(57) ABSTRACT

A determination mark formation portion is provided in each suspension board. In the determination mark formation portion, a recess having a given depth is provided in a base insulating layer. An outer peripheral portion is formed on the base insulating layer to surround the recess. A plating layer is formed on the outer peripheral portion. A circular hole is formed on a support substrate. The hole of the support substrate and the recess of the base insulating layer overlap each other.

6 Claims, 7 Drawing Sheets

(56) References Cited

FOREIGN PATENT DOCUMENTS

| JP | 2007-109725 A | 4/2007 |
|---|---|---|
| JP | 2007-201045 A | 8/2007 |
| JP | 2009-272549 A | 11/2009 |
| JP | 2010-040116 A | 2/2010 |
| JP | 2010-161302 A | 7/2010 |

OTHER PUBLICATIONS

JP 55-27267 Y2 Publsihed in Jun. 30, 1980 English Translation.*

Office Action issued Aug. 27, 2013 in JP Application No. 2010-207636.
Decision to Grant a Patent dated Mar. 18, 2014 in Japanese Application No. 2010-207636.
Office Action issued Jul. 1, 2014 in JP Application No. 2013-222737.
Office Action issued Feb. 6, 2015 in CN Application No. 201110278076.7.
Office Action issued Oct. 8, 2015 in CN Application No. 201110278076.7.

\* cited by examiner

F I G. 1
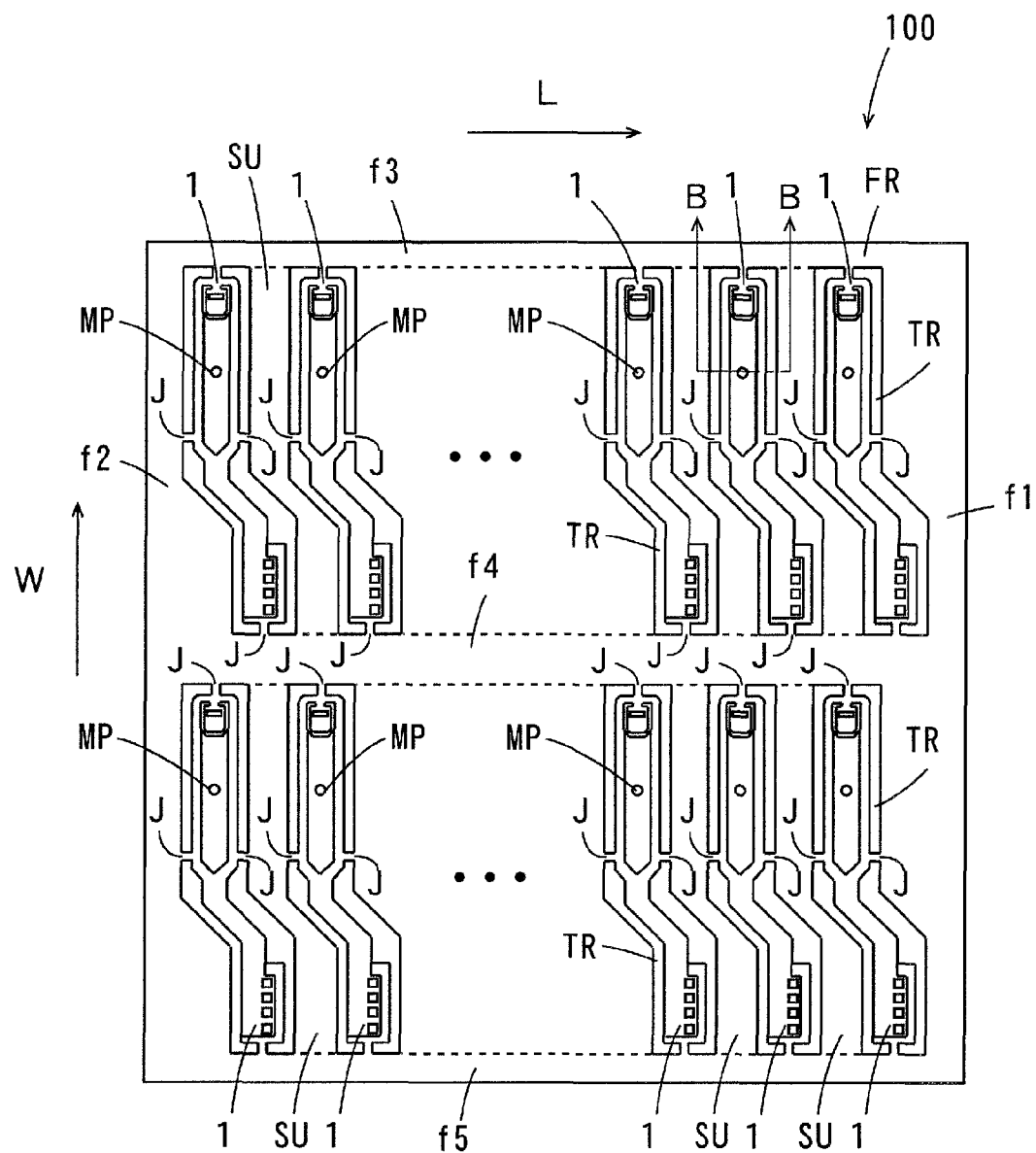

F I G. 3
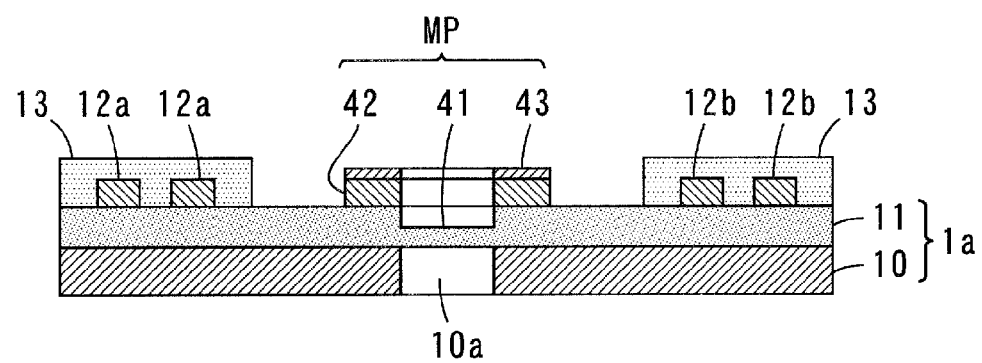

PRINTED CIRCUIT BOARD, PRINTED CIRCUIT BOARD ASSEMBLY SHEET AND METHOD OF MANUFACTURING THE SAME

BACKGROUND OF THE INVENTION

1. Field of the Invention

The present invention relates to a printed circuit board, a printed circuit board assembly sheet and a method of manufacturing the same.

2. Description of the Background Art

Actuators are employed in drives such as hard disk drives. Such an actuator includes an arm arranged rotatably with respect to a rotation shaft and a suspension board with circuit for a magnetic head that is attached to the arm. The suspension board with the circuit is a printed circuit board for positioning the magnetic head with a desired track of a magnetic disk.

In manufacturing steps of such a suspension board with circuit, a plurality of suspension boards with circuits are integrally prepared as a suspension board assembly sheet with circuits. In the suspension board assembly sheet with circuits, a plurality of suspension boards with circuits are provided in alignment within a rectangular support frame. After that, each suspension board with circuit is separated from the suspension board assembly sheet with circuits.

In the foregoing manufacturing steps, it is determined whether or not each suspension board with circuit is acceptable by a continuity test or the like before each suspension board with circuit is separated from the suspension board assembly sheet with circuits. The suspension board with circuit determined as a defective item in the foregoing determination is marked using ink or the like. Thus, it can be easily determined whether or not each suspension board with circuit is acceptable in the following step.

In the suspension board assembly sheet with circuits described in JP 2010-161302 A, for example, each suspension board with circuit is provided with a determination mark formation portion. Each suspension board with circuit is configured such that a conductor pattern is formed on a metal support layer with a base insulating layer sandwiched therebetween. In this case, the determination mark formation portion is provided on one surface of the metal support layer, and an opening is provided in the base insulating layer such that the determination mark formation portion is exposed. Ink is applied to the determination mark formation portion of the suspension board with circuit determined as a defective item. Thus, it can be determined whether or not each suspension board with circuit is acceptable in the following step based on whether or not the ink is applied to the determination mark formation portion.

Determination as to whether or not the suspension board with circuit is acceptable needs to be made in various situations. For example, when the actuator of the hard disk does not perform normal operation, it needs to determine whether or not the suspension board with circuit attached to the arm is acceptable in order to confirm that there is no problem in the suspension board with circuit.

In the suspension board assembly sheet with circuits described in JP 2010-161302 A, the determination mark formation portion needs to be confirmed from the side of one surface of the suspension board with circuit in order to determine whether or not the suspension board with circuit is acceptable. Therefore, it is difficult to determine whether or not the suspension board with circuit is acceptable when the one surface of the suspension board with circuit is hid by the arm of the actuator, for example.

BRIEF SUMMARY OF THE INVENTION

An object of the present invention is to provide a printed circuit board that can be determined in various situations whether or not it is acceptable, a printed circuit board assembly sheet and a method of manufacturing the same.

(1) According to one aspect of the present invention, a printed circuit board includes a support substrate having an opening, a base insulating layer formed on the support substrate to cover the opening, and a conductor pattern formed on the base insulating layer.

In the printed circuit board, the base insulating layer is formed on the support substrate to cover the opening of the support substrate, and the conductor pattern is formed on the base insulating layer.

When ink is applied to a region of the base insulating layer overlapping the opening, the presence of the ink can be confirmed from the side of one surface of the printed circuit board, and the presence of the ink can be confirmed from the side of the other surface of the printed circuit board through the opening of the support substrate and the base insulating layer. Here, the one surface of the printed circuit board refers to the surface of the printed circuit board on which the conductor pattern is provided, and the other surface refers to the surface of the printed circuit board on which the support substrate is provided.

Accordingly, when the ink is applied in the foregoing manner to the printed circuit board determined as an acceptable item or the printed circuit board determined as a defective item based on a result of determination as to whether or not each printed circuit board is acceptable, it can be determined from any of the side of the one surface and the side of the other surface of the printed circuit board whether or not the ink is applied. As a result, it can be determined in various situations whether or not each printed circuit board is acceptable.

(2) A thickness of a region of the base insulating layer overlapping the opening of the support substrate may be smaller than a thickness of other regions of the base insulating layer. In this case, the presence of the ink applied to the region of the base insulating layer overlapping the opening can be easily confirmed from the side of the other surface of the printed circuit board. This makes it easy to determine from the side of the other surface of the printed circuit board whether or not the printed circuit board is acceptable.

(3) The printed circuit board may further include a metal layer formed on the base insulating layer along a region of the base insulating layer overlapping the opening.

In this case, the ink is also applied to the metal layer, so that the presence of the ink can be easily confirmed from the side of the one surface of the printed circuit board. This makes it easy to determine from the side of the one surface of the printed circuit board whether or not the printed circuit board is acceptable. In addition, the metal layer is formed along the region of the base insulating layer overlapping the opening of the support substrate, thus allowing the ink to be efficiently applied to the region of the base insulating layer overlapping the opening and to the metal layer.

(4) The metal layer may be formed on the base insulating layer to surround the region of the base insulating layer overlapping the opening. In this case, the ink can be efficiently and reliably applied to the region of the base insulating layer overlapping the opening and to the metal layer.

(5) The metal layer may be made of a material that is the same as a material for the conductor pattern. In this case, the metal layer and the conductor pattern can be formed in a common step during manufacture of the printed circuit board. This inhibits the manufacturing steps from being complicated.

(6) The printed circuit board may further include a cover insulating layer provided on the base insulating layer to cover the conductor pattern, and a coating layer provided on the metal layer and having higher oxidation resistance than the metal layer.

In this case, the metal layer and the conductor pattern are prevented from being oxidized. Moreover, the ink is applied to the coating layer, thereby making it easy to confirm the presence of the ink from the side of the one surface of the printed circuit board.

(7) The conductor pattern and the metal layer may each contain copper, and the coating layer may contain gold. In this case, oxidation of the metal layer is sufficiently prevented by the coating layer. In addition, when the ink is applied to the coating layer, contrast between the coating layer and the ink is increased because of the high-gloss coating layer, thus making is easier to confirm the presence of the ink.

(8) According to another aspect of the present invention, a printed circuit board assembly sheet has a configuration in which a plurality of the printed circuit boards according to the one aspect of the present invention are integrally provided.

In the printed circuit board assembly sheet, the plurality of the printed circuit boards according to the one aspect of the present invention are integrally provided. Therefore, the ink can be applied to the region of the base insulating layer overlapping the opening of the printed circuit board determined as an acceptable item or the printed circuit board determined as a defective item based on a result of determination as to whether or not each printed circuit board is acceptable. In this case, it can be determined from any of the side of the one surface and the side of the other surface of each printed circuit board whether or not the ink is applied. As a result, it can be determined in various situations whether or not each printed circuit board is acceptable.

(9) According to still another aspect of the present invention, a method of manufacturing a printed circuit board assembly sheet in which a plurality of printed circuit boards are integrally provided includes the steps of forming base insulating layers of the plurality of printed circuit boards on a support substrate, forming conductor patterns on the base insulating layers of the plurality of printed circuit boards, respectively, forming openings in respective regions of the support substrate corresponding to the plurality of printed circuit boards, determining whether or not each of the plurality of printed circuit boards is acceptable, and applying ink on a region of the base insulating layer overlapping the opening of the printed circuit board determined as an acceptable item or the printed circuit board determined as a defective item.

In the manufacturing method, the base insulating layers of the plurality of printed circuit boards are formed on the support substrate, and the conductor patterns are formed on the respective base insulating layers of the plurality of printed circuit boards. The openings are formed in the respective regions of the support substrate corresponding to the plurality of printed circuit boards.

After determination as to whether or not each printed circuit board is acceptable, the ink is applied to the region of the base insulating layer overlapping the opening of the printed circuit board determined as the acceptable item or the printed circuit board determined as the defective item.

In this case, the presence of the ink can be confirmed from the side of one surface of the printed circuit board, and the presence of the ink can be confirmed from the side of the other surface of the printed circuit board through the opening of the support substrate and the base insulating layer. In this manner, it can be determined from any of the side of the one surface and the side of the other surface of the printed circuit board whether or not the ink is applied, thus making it possible to determine in various situations whether or not each printed circuit board is acceptable in the following step.

According to the present invention, it can be determined in various situations whether or not each printed circuit board is acceptable.

Other features, elements, characteristics, and advantages of the present invention will become more apparent from the following description of preferred embodiments of the present invention with reference to the attached drawings.

BRIEF DESCRIPTION OF THE SEVERAL VIEWS OF THE DRAWINGS

FIG. 1 is a top view of an assembly sheet including suspension boards according to one embodiment of the present invention;

FIG. 3 is a sectional view of the suspension board of FIG. 2 taken along the line A-A;

DETAILED DESCRIPTION OF THE INVENTION

Figure 2:
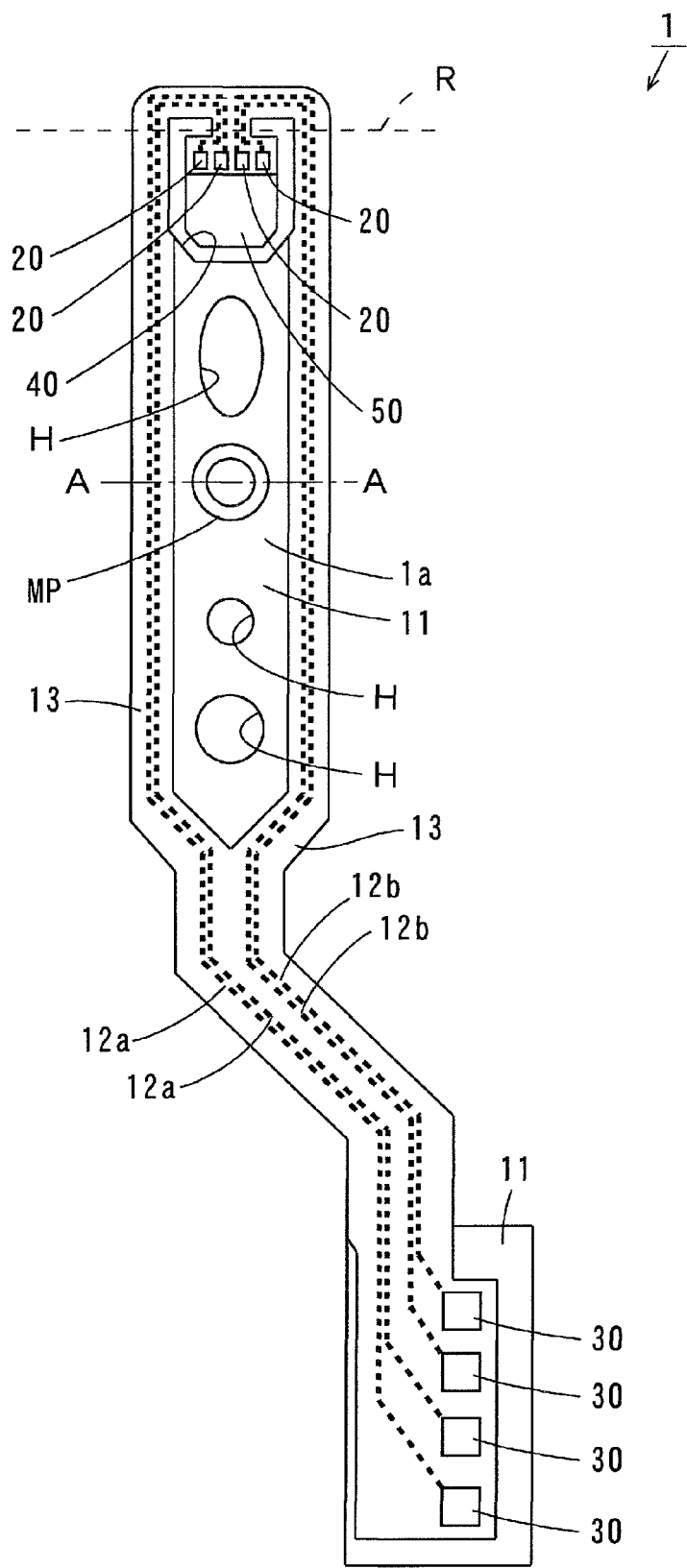
FIG. 2 is a plan view of one suspension board.

Description will be made of a printed circuit board, a printed circuit board assembly sheet and a method of manufacturing the same according to embodiments of the present invention with reference to the drawings. In the present embodiment, a suspension board with circuit is described as one example of the printed circuit board.

(1) Assembly Sheet

FIG. 1 is a top view of a suspension board assembly sheet with circuits according to the present embodiment. The suspension board assembly sheet with circuits (hereinafter referred to as the assembly sheet) is a half-finished product of suspension boards with circuits (hereinafter referred to as suspension boards) in a manufacture process.

In FIG. 1, a direction parallel to a pair of sides of the assembly sheet 100 that are opposite to each other is referred to as a longitudinal direction L, and a direction perpendicular to the longitudinal direction L is referred to as a width direction W. The assembly sheet 100 is formed of a metal support substrate.

The assembly sheet 100 includes a quadrangular support frame FR and a plurality of long-sized suspension boards 1. The support frame FR is composed of a pair of end frames f1, f2 that is parallel to the width direction W, and side frames f3, f4, f5 that are parallel to the longitudinal direction L and provided at equal spacings. The plurality of suspension boards 1 each extending in the width direction W are formed in two rows within the support frame FR. The suspension boards 1 arranged in one row are provided between the side frames f3, f4, and the suspension boards 1 arranged in the other row are provided between the side frames f4, f5. A separation groove TR is formed along an outer edge of each suspension board 1.

While the plurality of suspension boards 1 are formed in the two rows in the assembly sheet 100 in the example of FIG. 1, the plurality of suspension boards 1 may be formed in three or more rows or may be formed in one row in the assembly sheet 100.

A support portion SU is formed between adjacent suspension boards 1. Both ends of each suspension board 1 are coupled to the side frames f3, f4 or the side frames f4, f5 by coupling portions J. Each side of the suspension board 1 is coupled to the support portion SU or the end frame f1 or f2 by a coupling portion J. In this manner, the plurality of suspension boards 1 are supported while being arranged in the two rows in the longitudinal direction L within the support frame FR.

A determination mark formation portion MP is provided in each suspension board 1. It is determined whether or not each suspension board 1 is acceptable, and ink is applied to the determination mark formation portion MP of the suspension board 1 determined as a defective item in a final stage of manufacturing steps of the assembly sheet 100. This makes it possible to easily determine whether or not the suspension board 1 is acceptable in the following step based on whether or not the ink is applied to the determination mark formation portion MP. Details of the determination mark formation portion MP will be described below.

After that, the coupling portions J are cut, so that each suspension board 1 is separated from the support frame FR and the support portion SU. Details of the method of manufacturing the assembly sheet 100 will be described below.

(2) Configuration of the Suspension Board

FIG. 2 is a plan view of one suspension board 1, and FIG. 3 is a sectional view of the suspension board 1 of FIG. 2 taken along the line A-A.

As shown in FIG. 2, the suspension board 1 includes a suspension body 1a formed of a support substrate 10 (see FIG. 3) and a base insulating layer 11, described below. At the tip of the suspension body 1a, a U-shaped opening 40 is formed, thereby providing a magnetic head supporting portion (hereinafter referred to as a tongue) 50. The tongue 50 is bent along the broken line R to form a given angle with respect to the suspension body 1a.

Four electrode pads 20 are formed at an end of the tongue 50. Four electrode pads 30 are formed at the other tip of the suspension body 1a. The four electrode pads 20 on the tongue 50 and the four electrode pads 30 at the other tip of the suspension body 1a are electrically connected to one another through a pair of liner conductor traces 12a and a pair of linear conductor traces 12b. The pair of conductor traces 12a are provided along one side of the suspension body 1a, and the pair of conductor traces 12b are provided along the other side of the suspension body 1a. The conductor traces 12a, 12b are covered with a cover insulating layer 13.

The determination mark formation portion MP and a plurality of holes H are formed between the pair of conductor traces 12a and the pair of conductor traces 12b.

FIG. 3 shows the cross section of the determination mark formation portion MP and its peripheral portion in the suspension board 1.

The base insulating layer 11 made of polyimide is formed on the support substrate 10 made of stainless steel. The conductor traces 12a, 12b made of copper are formed on the base insulating layer 11. The cover insulating layer 13 made of polyimide is formed to cover the four conductor traces 12a, 12b.

The determination mark formation portion MP is provided between the pair of conductor traces 12a and the pair of conductor traces 12b. A circular (see FIG. 2) recess 41 having a given depth is provided in the base insulating layer 11 in the determination mark formation portion MP. The shape of the recess 41 is not limited to the circular shape. It may be another shape such as a triangular shape or a quadrangular shape. An outer peripheral portion 42 made of copper is formed on the base insulating layer 11 to surround the recess 41. A plating layer 43 made of gold is formed on the outer peripheral portion 42. In this example, the outer peripheral portion 42 and the plating layer 43 each have an annular shape.

A circular hole 10a is formed in the support substrate 10. The hole 10a of the support substrate 10 and the recess 41 of the base insulating layer 11 overlap each other. The diameter of the hole 10a is preferably the same as that of the recess 41. The shape of the hole 10a is not limited to the circular shape. It may be another shape such as a triangular shape or a quadrangular shape.

(3) The Method of Manufacturing the Assembly Sheet 100

Figure 4:
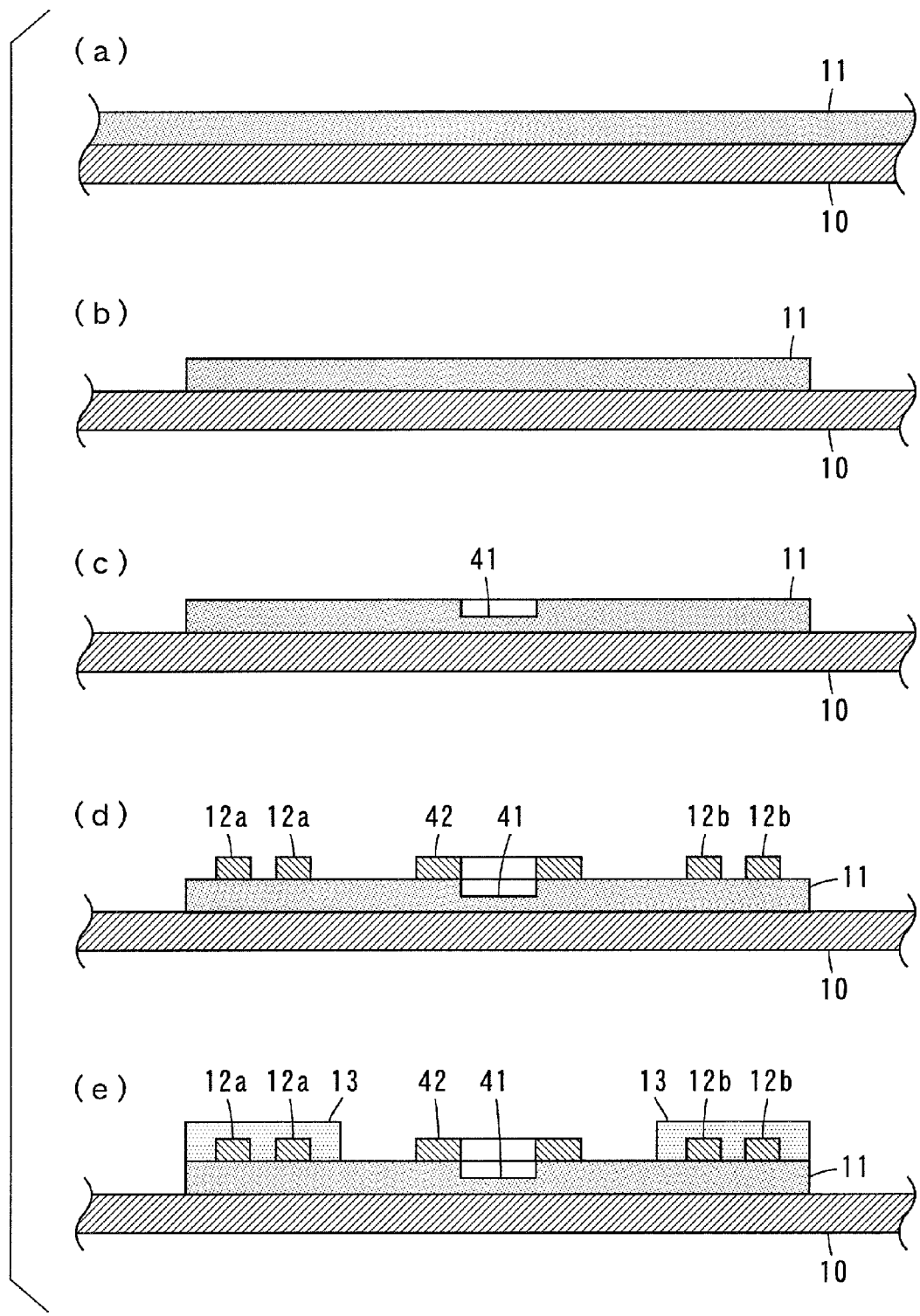
FIGS. 4 (a) to (e) are sectional views for use in illustrating steps in one example of a method of manufacturing the assembly sheet according to the present embodiment.
Figure 5:
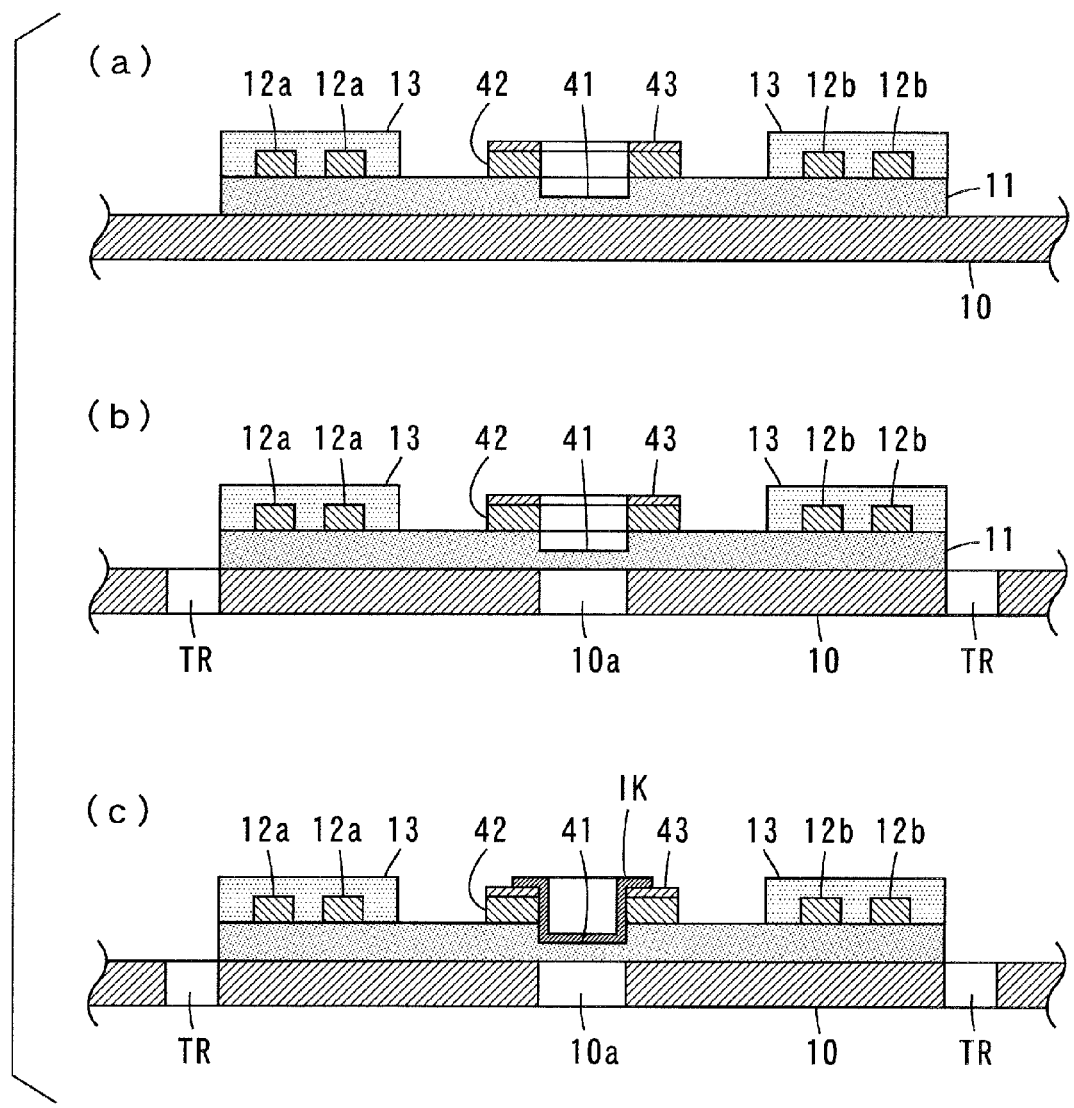
FIGS. 5 (a) to (c) are sectional views for use in illustrating steps in the one example of the method of manufacturing the assembly sheet according to the present embodiment.

Next, description will be made of the method of manufacturing the assembly sheet 100. FIGS. 4 and 5 are sectional views for use in illustrating steps in one example of the method of manufacturing the assembly sheet 100 according to the present embodiment. FIGS. 4 and 5 correspond to the cross section taken along the line B-B of FIG. 1.

First, the base insulating layer 11 made of polyimide is formed on the long-sized support substrate 10 made of stainless steel as shown in FIG. 4 (a). A two-layer base material having a laminated structure of the support substrate 10 and the base insulating layer 11 may be employed.

The material for the support substrate 10 is not limited to stainless steel. Another metal material such as aluminum (Al) may be used. The thickness of the support substrate 10 is, for example, not less than 5 µm and not more than 50 µm, and preferably not less than 10 µm and not more than 30 µm. The material for the base insulating layer 11 is not limited to polyimide. Another resin material such as epoxy may be used. The thickness of the base insulating layer 11 is, for example, not less than 3 µm and not more than 20 µm, and preferably not less than 5 µm and not more than 15 µm.

The base insulating layer 11 is subsequently subjected to etching with an etching resist (not shown) formed on the base insulating layer 11, thereby forming the base insulating layer 11 for each suspension board 1 on the support substrate 10 as shown in FIG. 4 (b). Next, half etching is performed on a portion of the base insulating layer 11 corresponding to the determination mark formation portion MP (FIG. 2) with an etching resist (not shown) formed on the base insulating layer 11, thereby forming the recess 41 in the base insulating layer 11 as shown in FIG. 4 (c).

The depth of the recess 41 is, for example, not less than 3 µm and not more than 12 µm, and preferably not less than 4 µm and not more than 8 µm. The thickness of the base insulating layer 11 from the bottom surface of the recess 41 to the upper surface of the support substrate 10 is, for example, not less than 5 µm and not more than 15 µm, and preferably not less than 8 µm and not more than 12 µm. The diameter of an upper opening of the recess 41 is, for example, not less than 100 μm and not more than 600 μm, and preferably not less than 100 μm and not more than 300 μm.

The conductor traces 12a, 12b and the outer peripheral portion 42 are then formed on the base insulating layer 11 by electrolytic plating as shown in FIG. 4 (d). The conductor traces 12a, 12b and the outer peripheral portion 42 may be formed by an additive method, a semi-additive method, or another method such as a subtractive method.

The material for the conductor traces 12a, 12b and the outer peripheral portion 42 is not limited to copper. Another metal such as gold (Au) and aluminum or an alloy such as a copper alloy and an aluminum alloy may be employed. The thickness of each of the conductor traces 12a, 12b and the outer peripheral portion 42, for example, is not less than 3 μm and not more than 16 μm, and preferably not less than 6 μm and not more than 13 μm. The width of each of the conductor traces 12a, 12b is, for example, not less than 12 μm and not more than 60 μm, and preferably not less than 16 μm and not more than 50 μm. The outer diameter of the outer peripheral portion 42 is, for example, not less than 100 μm and not more than 700 μm, and preferably not less than 100 μm and not more than 400 μm. The inner diameter of the outer peripheral portion 42 is preferably equal to the diameter of the recess 41 of the base insulating layer 11.

Furthermore, a cover insulating layer made of polyimide is formed on the support substrate 10 to cover the conductor traces 12a, 12b, the outer peripheral portion 42 and the base insulating layer 11, and the cover insulating layer is then subjected to etching with an etching resist (not shown) formed on the cover insulating layer. Accordingly, the cover insulating layer 13 is formed on the base insulating layer 11 to cover the conductor traces 12a, 12b as shown in FIG. 4 (e).

The material for the cover insulating layer 13 is not limited to polyimide. Another insulating material such as epoxy may be used. The thickness of the cover insulating layer 13 is, for example, not less than 5 μm and not more than 30 μm, and preferably not less than 10 μm and not more than 20 μm.

The plating layer 43 made of gold is formed on the outer peripheral portion 42 by electrolytic plating as shown in FIG. 5 (a). In this case, a plating layer may be formed on the electrode pads 20, 30 of FIG. 2 at the same time.

The material for the plating layer 43 is not limited to gold. Nickel or tin may be employed. The thickness of the plating layer 43 is, for example, not less than 0.1 μm and not more than 10 μm, and preferably not less than 1 μm and not more than 5 μm.

As shown in FIG. 5 (b), a region of the support substrate 10 excluding regions of the suspension body 1a and the support portions SU of FIG. 2 is removed by etching, so that the separation groove TR, the hole 10a, the holes H (FIG. 2) and the opening 40 (FIG. 2) are formed. In this manner, the assembly sheet 100 including the plurality of suspension boards 1 is completed.

After that, it is determined whether or not each suspension board 1 is acceptable using an inspection apparatus that is not shown. For example, a continuity test is performed on the conductor traces 12a, 12b, and the presence/absence of disconnection in the conductor traces 12a, 12b is determined. Moreover, each suspension board 1 is visually inspected, and it is determined whether or not the suspension board 1 is disfigured. When the conductor traces 12a, 12b are disconnected or disfigured, the suspension board 1 is determined as a defective item.

Ink IK of black, for example, is applied to the determination mark formation portion MP of the suspension board 1 determined as a defective item as shown in FIG. 5 (c). More specifically, the ink IK is applied to at least part of the bottom surface of the recess 41 of the base insulating layer 11 and at least part of the upper surface of the plating layer 43. In this case, since the plating layer 43 is provided to surround the recess 41 of the base insulating layer 11, the ink IK can be simultaneously applied to the bottom surface of the recess 41 of the base insulating layer 11 and the plating layer 43 using a felt-tipped pen or the like. Meanwhile, the ink IK is not applied to the determination mark formation portion MP of the suspension board 1 determined as an acceptable item.

After that, the coupling portions J (FIG. 1) of the assembly sheet 100 are cut, thereby separating each suspension board 1 from the support frame FR.

(4) Determination Using the Determination Mark Formation Portion

As described above, the ink IK is applied to the determination mark formation portion MP of the suspension board 1 determined as a defective item. It is confirmed whether or not the ink IK is applied to the determination mark formation portion MP in the following step, thereby determining whether or not the suspension board 1 is acceptable.

It can be confirmed whether or not the ink IK is applied to the determination mark formation portion MP from any of the side of the top surface and the side of the back surface of the suspension board 1 in the present embodiment. Here, the top surface of the suspension board 1 refers to the surface of the suspension board 1 (top surface in FIG. 3) on which the conductor traces 12a, 12b and the cover insulating layer 13 are provided, and the back surface refers to the surface of the suspension board 1 (lower surface in FIG. 3) on which the support substrate 10 is provided.

Figure 6:
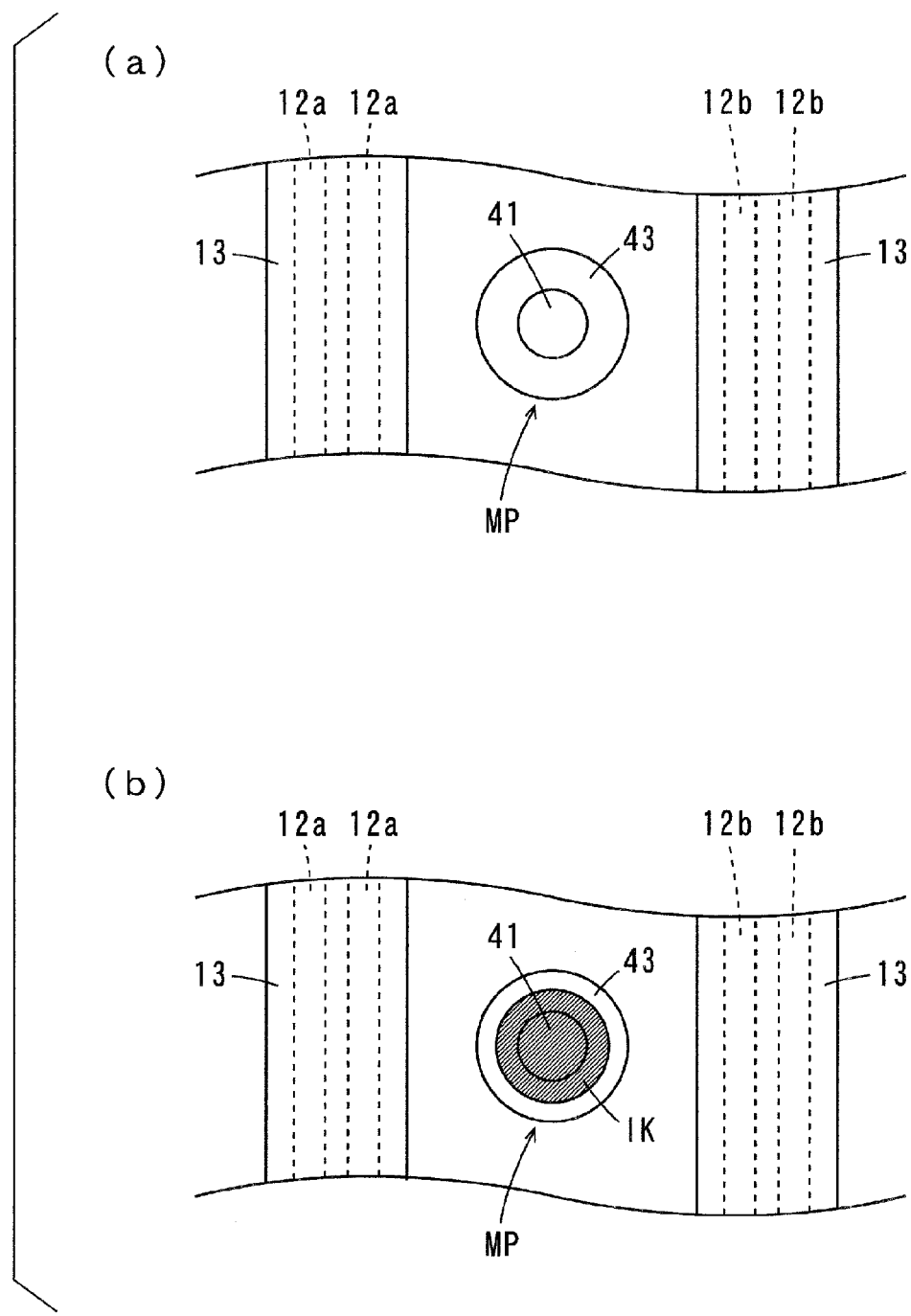
FIGS. 6 (a), (b) are enlarged plan views of a determination mark formation portion and its peripheral portion seen from the side of a top surface of the suspension board.
Figure 7:
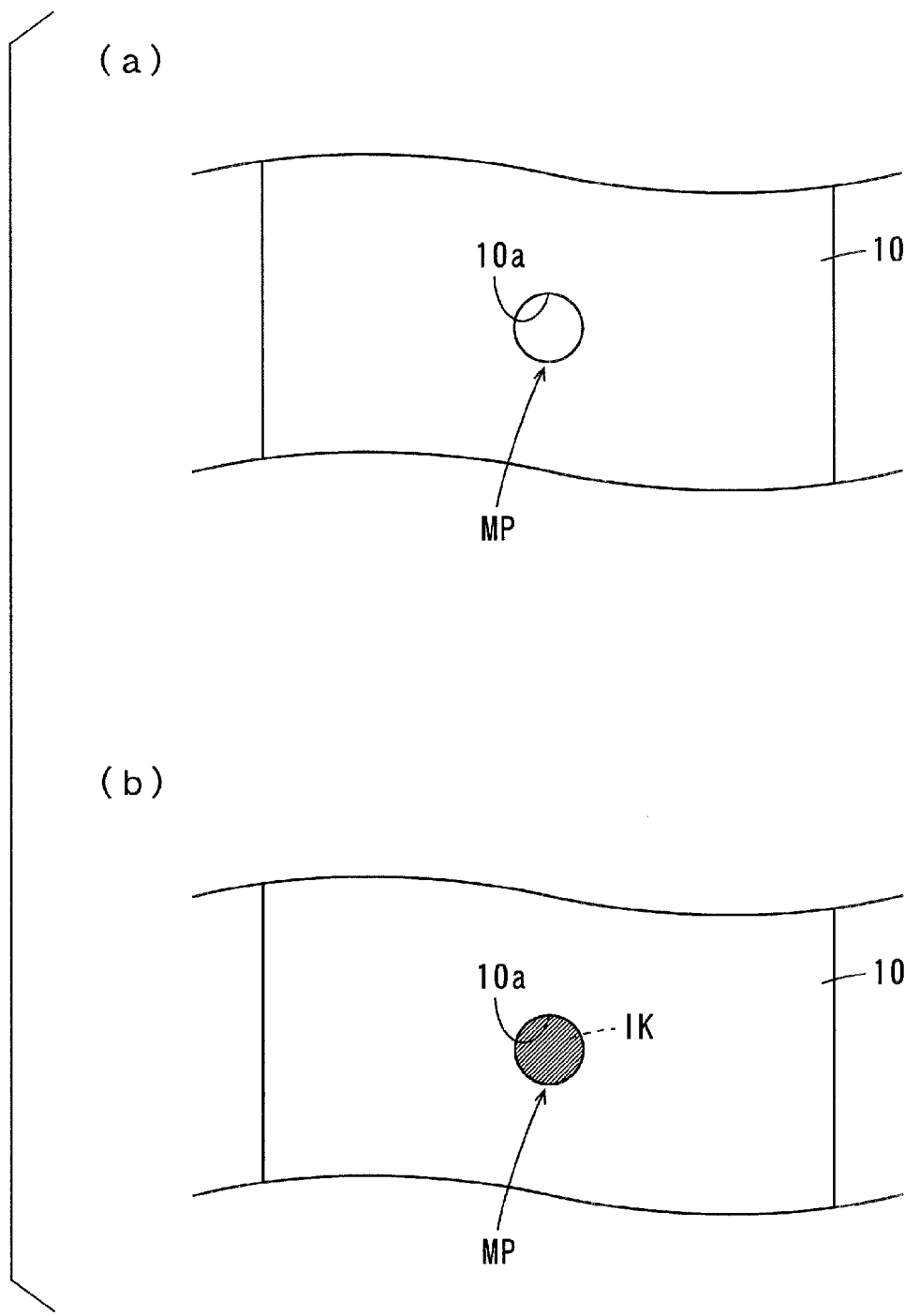
FIGS. 7 (a), (b) are enlarged plan views of the determination mark formation portion and its peripheral portion seen from the side of a back surface of the suspension board.

FIG. 6 is an enlarged plan view of the determination mark formation portion MP and its peripheral portion seen from the side of the top surface of the suspension board 1, and FIG. 7 is an enlarged plan view of the determination mark formation portion MP and its peripheral portion seen from the side of the back surface of the suspension board 1. FIG. 6 (a) and FIG. 7 (a) show the determination mark formation portion MP to which the ink IK is not applied, and FIG. 6 (b) and FIG. 7 (b) show the determination mark formation portion MP to which the ink IK is applied.

As shown in FIG. 6 (a), the plating layer 43 and the recess 41 of the base insulating layer 11 are exposed on the top surface of the suspension board 1. In the suspension board 1 determined as a defective item, the ink IK is applied to the plating layer 43 and the bottom surface of the recess 41 of the base insulating layer 11 as shown in FIG. 6 (b). The presence/absence of the ink IK is confirmed from the side of the top surface of the suspension board 1, thereby determining whether or not the suspension board 1 is acceptable.

In the back surface of the suspension board 1, the surface of the base insulating layer 11 on the opposite side to the recess 41 is exposed within the hole 10a of the support substrate 10 as shown in FIG. 7 (a). In the present embodiment, the material for the base insulating layer 11 and the depth of the recess 41 are set such that the color of the ink IK can be visually confirmed through the recess 41 of the base insulating layer 11 within the hole 10a of the support substrate 10 as shown in FIG. 7 (b) when the ink IK is applied to the bottom surface of the recess 41. Thus, the presence/absence of the ink IK is confirmed from the side of the back surface of the suspension board 1, thereby determining whether or not the suspension board 1 is acceptable.

Here, with the assembly sheet 100 placed on a platform of a transport apparatus such as a belt conveyer such that the top surface of the suspension board 1 is directed upward, for example, the determination mark formation portion MP is confirmed from the side of the top surface of the suspension board 1.

In this case, the color of the platform can be visually confirmed from the side of the top surface of the suspension board 1 through the hole 10*a* of the support substrate 10 and the recess 41 of the base insulating layer 11. The color of the platform differs depending on kinds of the transport apparatus. If the color of the platform is similar to the color of the ink IK, the color of the platform is recognized as the color of the ink IK. This may result in false recognition that the ink IK is applied to the bottom surface of the recess 41 of the base insulating layer 11 though the ink IK is not actually applied.

When the color of the base insulating layer 11 is similar to the color of the ink IK, the color of the base insulating layer 11 may be erroneously recognized as the color of the ink IK.

Therefore, the ink IK is also applied to the plating layer 43 in the present embodiment. The color (gold in this example) of the plating layer 43 has high contrast to the color (black in this example) of the ink IK. The plating layer 43 is not optically transparent, and is provided to overlap the support substrate 10 and the outer peripheral portion 42 that are not optically transparent. This makes it easy to determine whether or not the ink IK is applied to the plating layer 43. As a result, it can be accurately determined whether or not the suspension board 1 is acceptable.

Meanwhile, the determination mark formation portion MP is confirmed from the side of the back surface of the suspension board 1 with the suspension board 1 attached to the arm of the actuator, for example. In this case, the arm is arranged on the side of the top surface of the suspension board 1. Therefore, the color of the arm can be visually recognized from the side of the back surface of the suspension board 1 through the recess 41 of the base insulating layer 11. If the color of the arm is similar to the color of the ink IK, the color of the arm is recognized as the color of the ink IK. This may result in false recognition that the ink IK is applied to the bottom surface of the recess 41 of the base insulating layer 11 though the ink IK is not actually applied.

Unlike the color of the platform of the foregoing transport apparatus, however, actuators of any kind have substantially the same color. Thus, the color of the actuator can be prevented from being erroneously recognized as the color of the ink IK by using the ink IK of a different color from the color of the actuator. Accordingly, it can be accurately determined whether or not the suspension board 1 is acceptable.

(5) Effects of the Embodiment

As described above, it can be confirmed whether or not the ink IK is applied to the determination mark formation portion MP from any of the side of the top surface and the side of the back surface in the suspension board 1 according to the present embodiment. Thus, it can be determined whether or not the suspension board 1 is acceptable in various situations.

In the suspension board 1 according to the present embodiment, the ink IK applied to the recess 41 of the base insulating layer 11 can be visually recognized from the side of the back surface of the suspension board 1 through the hole 10*a* of the support substrate 10 and the base insulating layer 11, thus eliminating the need to apply the ink IK to the back surface of the suspension board 1. Furthermore, the plating layer 43 is provided to surround the recess 41 of the base insulating layer 11, thus allowing the ink IK to be simultaneously applied to the recess 41 of the base insulating layer 11 and the plating layer 43. This allows for efficient application operation of the ink IK.

In the suspension board 1 according to the present embodiment, the outer peripheral portion 42 made of the same material as that of the conductor traces 12*a*, 12*b* is provided on the base insulating layer 11, and the plating layer 43 is provided on the outer peripheral portion 42. In this case, the conductor traces 12*a*, 12*b* and the outer peripheral portion 42 can be simultaneously formed during manufacture of the assembly sheet 100. Moreover, the plating layer 43 can be easily formed on the outer peripheral portion 42 by electrolytic plating. This inhibits the manufacturing steps from being complicated.

The plating layer 43 is formed on the outer peripheral portion 42, thereby preventing oxidation of the outer peripheral portion 42 and providing high contrast between the plating layer 43 and the ink IK.

(6) Other Embodiments

While the outer peripheral portion 42 and the plating layer 43 are provided on the base insulating layer 11 in the above-described embodiment, the outer peripheral portion 42 and the plating layer 43 may not be provided on the base insulating layer 11 if determination as to whether or not the ink is applied to the determination mark formation portion MP can be made from the side of the top surface of the suspension board 1.

While the outer peripheral portion 42 and the plating layer 43 are provided to surround the region (the recess 41) of the base insulating layer 11 overlapping the hole 10*a* of the support substrate 10 in the above-described embodiment, the present invention is not limited to this. The outer peripheral portion 42 and the plating layer 43 may be provided along part of the region of the base insulating layer 11 overlapping the hole 10*a* of the support substrate 10.

The plating layer 43 may not be formed on the outer peripheral portion 42 when gold or another metal having high oxidation resistance is used as the material for the outer peripheral portion 42. The cover insulating layer 13 may not be formed when gold or another metal having high oxidation resistance is used as the material for the conductor traces 12*a*, 12*b*. While the same material is used for the outer peripheral portion 42 and the conductor traces 12*a*, 12*b* in the above-described embodiment, different materials may be employed.

While the recess 41 of the base insulating layer 11 is provided to open toward the side of the top surface of the suspension board 1 in the above-described embodiment, the present invention is not limited to this. The recess 41 of the base insulating layer 11 may be provided to open toward the side of the back surface of the suspension board 1. The recess 41 may be provided on the both surfaces of the base insulating layer 11 to open to the sides of the top surface and the back surface of the suspension board 1.

The recess 41 may not be provided in the base insulating layer 11 if the color of the ink IK applied to the base insulating layer 11 can be visually recognized from the side of the back surface of the suspension board 1 through the base insulating layer 11.

While the area of the cross section of the hole 10*a* parallel to the one surface of the support substrate 10 is equal to the area of the cross section of the recess 41 parallel to the one surface of the support substrate 10 in the above-described embodiment, the present invention is not limited to this. The area of the cross section of the hole 10*a* parallel to the one surface of the support substrate 10 may be different from the area of the cross section of the recess 41 parallel to the one surface of the support substrate 10. The hole 10*a* of the support substrate 10 may be provided to overlap parts of the conductor traces 12*a*, 12*b*. However, the hole 10*a* of the support substrate 10 is preferably provided not to overlap the conductor traces 12a, 12b in order to ensure reliability of the conductor traces 12a, 12b.

While the ink is applied to the determination mark formation portion MP of the suspension board 1 determined as a defective item in the above-described embodiment, the ink may be applied to the determination mark formation portion MP of the suspension board 1 determined as an acceptable item instead.

It may be visually confirmed whether or not the ink is applied to the determination mark formation portion MP, or the determination mark formation portion MP may be shot by a camera from the sides of the top surface and the back surface of the suspension board 1, and an obtained image may be analyzed for confirmation. The determination mark formation portion MP may be irradiated with light from the side of the top surface or the back surface of the suspension board 1, and confirmation may be performed based on reflected light.

While the assembly sheet 100 has the quadrangular shape in the above-described embodiment, the present invention is not limited to this. The assembly sheet 100 may have another shape such as an elliptical shape and a triangular shape.

While the suspension board assembly sheet with circuits is described as a printed circuit board assembly sheet in the above-described embodiment, printed circuit boards of the printed circuit board assembly sheet according to the present invention are not limited to the suspension boards with circuits. For example, the printed circuit boards may be other printed circuit boards such as flexible printed circuit boards, substrates for COF (Chip On Film), and substrates for TAB (Tape Automated Bonding).

(7) Correspondences Between Elements in the Claims and Parts in Embodiments

In the following paragraph, non-limiting examples of correspondences between various elements recited in the claims below and those described above with respect to various preferred embodiments of the present invention are explained.

In the foregoing embodiments, the assembly sheet 100 is an example of a printed circuit board assembly sheet, the suspension board 1 with circuit is an example of a printed circuit board, the support substrate 10 is an example of a support substrate, the hole 10a is an example of an opening, the base insulating layer 11 is an example of a base insulating layer, the conductor traces 12a, 12b are an example of a conductor pattern, the outer peripheral portion 42 is an example of a metal layer, the cover insulating layer 13 is an example of a cover insulating layer, and the plating layer 43 is an example of a coating layer.

As each of various elements recited in the claims, various other elements having configurations or functions described in the claims can be also used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

INDUSTRIAL APPLICABILITY

The present invention can be utilized for manufacturing a printed circuit board or the like.

We claim:

1. A printed circuit board comprising:
    a support substrate having a first opening;
    a base insulating layer formed on said support substrate to cover said first opening, the base insulating layer having a recess which overlaps the first opening, the recess having an open upper end and a closed bottom surface;
    a conductor pattern formed on said base insulating layer;
    a metal layer formed on said base insulating layer to surround the recess of said base insulating layer, a second opening formed in the metal layer, the second opening overlapping the recess; and
    ink applied to at least a portion of the closed bottom surface of the recess.

2. The printed circuit board according to claim 1, wherein a thickness of the region of said base insulating layer overlapping said first opening of said support substrate is smaller than a thickness of other regions of said base insulating layer.

3. The printed circuit board according to claim 1, wherein said metal layer is made of a material that is the same as a material for said conductor pattern.

4. The printed circuit board according to claim 3, further comprising:
    a cover insulating layer provided on said base insulating layer to cover said conductor pattern; and
    a coating layer provided on said metal layer and having higher oxidation resistance than said metal layer.

5. The printed circuit board according to claim 4, wherein said conductor pattern and said metal layer each contain copper; and said coating layer contains gold.

6. A printed circuit board assembly sheet comprising a plurality of printed circuit boards which are integrally provided, each of the plurality of printed circuit boards comprising:
    a support substrate having a first opening;
    a base insulating layer formed on said support substrate to cover said first opening, the base insulating layer having a recess which overlaps the first opening, the recess having an open upper end and a closed bottom surface;
    a conductor pattern formed on said base insulating layer; and
    a metal layer formed on said base insulating layer to surround the recess of said base insulating layer, a second opening formed in the metal layer, the second opening overlapping the recess,
        wherein ink is applied to at least a portion of the closed bottom surface of the recess of at least one printed circuit board of said plurality of printed circuit boards, such that the at least one printed circuit board is determined to be acceptable or defective.

* * * * *